United States Patent
Miyake et al.

(10) Patent No.: US 6,271,498 B1
(45) Date of Patent: Aug. 7, 2001

(54) APPARATUS FOR VAPORIZING LIQUID RAW MATERIAL AND METHOD OF CLEANING CVD APPARATUS

(75) Inventors: Koji Miyake; Hajime Kuwahara; Tsukasa Hayashi, all of Kyoto (JP)

(73) Assignee: Nissin Electric Co., LTD, Kyoto (JP)

( * ) Notice: Subject to any disclaimer, the term of this patent is extended or adjusted under 35 U.S.C. 154(b) by 0 days.

(21) Appl. No.: 09/102,017

(22) Filed: Jun. 22, 1998

(30) Foreign Application Priority Data

Jun. 23, 1997 (JP) .................................... 9-183184
Jun. 24, 1997 (JP) .................................... 9-184460

(51) Int. Cl.$^7$ .................................................. B23K 10/00
(52) U.S. Cl. ............................... 219/121.43; 118/723 VE; 216/74; 427/255.32
(58) Field of Search ........... 219/121.43, 121.36–121.59; 118/726, 723 VE, 723 E, 723 ER; 427/356; 438/485; 134/22.14, 18; 216/37, 74; 505/447; 392/386–406, 324–337; 373/11

(56) References Cited

U.S. PATENT DOCUMENTS

| | | | |
|---|---|---|---|
| 4,816,289 | * | 3/1989 | Komatsu et al. ................. 423/447.3 |
| 4,982,696 | * | 1/1991 | Kinoshita et al. ............. 118/723 VE |
| 5,204,314 | * | 4/1993 | Kirlin et al. ........................... 505/447 |
| 5,362,328 | * | 11/1994 | Gardiner et al. ..................... 118/726 |
| 5,405,654 | * | 4/1995 | Gabor et al. .......................... 427/356 |
| 5,413,671 | * | 5/1995 | Ketchum ................................. 216/37 |
| 5,541,386 | * | 7/1996 | Alvi et al. ........................ 219/121.38 |
| 5,563,092 | * | 10/1996 | Ohmi ..................................... 438/485 |
| 5,607,515 | * | 3/1997 | Takahashi .............................. 134/18 |
| 5,666,891 | * | 9/1997 | Titus et al. ............................ 110/250 |
| 5,709,757 | * | 1/1998 | Hatano et al. ..................... 134/22.14 |
| 5,834,060 | * | 11/1998 | Kawahara et al. .............. 427/255.32 |
| 5,882,416 | * | 3/1999 | Van Buskirk et al. .............. 118/726 |
| 5,993,679 | * | 11/1999 | Koide et al. ........................... 216/74 |

* cited by examiner

Primary Examiner—Teresa Walberg
Assistant Examiner—Quang Van
(74) Attorney, Agent, or Firm—Finnegan, Henderson, Farabow, Garrett & Dunner, L.L.P.

(57) ABSTRACT

A vaporizing apparatus has a vaporizing container into which a liquid raw material is introduced and which is made of metal, a heater for heating the vaporizing container to vaporize liquid introduced into the vaporizing container and a metal nozzle (an electrode) disposed in the vaporizing container in such a manner that the nozzle is electrically insulated from the vaporizing container. Moreover, the vaporizing apparatus has a cleaning-solution supply apparatus for supplying, to the inside portion of the vaporizing container, a cleaning solution for solving residues generated in the vaporizing container and a plasma generating power source for supplying high-frequency electric power to a position between the nozzle and the vaporizing container to generate plasma in the vaporizing container by using the vaporized cleaning solution.

13 Claims, 10 Drawing Sheets

US 6,271,498 B1

APPARATUS FOR VAPORIZING LIQUID RAW MATERIAL AND METHOD OF CLEANING CVD APPARATUS

BACKGROUND OF THE INVENTION

1. Field of the Invention

The present invention relates to a method of cleaning an MOCVD (Metal Organic Chemical Vapor Deposition) apparatus or another CVD apparatus having a vaporizer for vaporizing a liquid raw material by applying heat and a processing chamber for forming a thin film on a substrate by a CVD (Chemical Vapor Deposition) method using the raw material vaporized in the vaporizer. More specifically, the present invention relates to a method of removing residues in the vaporizer and the processing chamber.

2. Description of the Related Art

In general, a liquid material, which is liquid at room temperatures, is generally sent in a vaporized state by a method disclosed in Japanese Patent Laid-Open No. 50-211072 and using a so-called bubbler or a bubbling apparatus. Also in a process for manufacturing semiconductors, the above-mentioned method is employed in a multiplicity of film forming apparatuses including those for forming TEOS (tetraethoxyorthosilane) films or those for forming superconductive thin films.

On the other hand, dielectric thin films have attracted attention in recent years as an important technique for manufacturing next-generation DRAM (Dynamic Random Access Memory) and FRAM (Ferroelectric Randam Access Memory) apparatuses, the dielectric or ferroelectric thin films including, for example, BST ($BaSrTiO_3$, that is, barium strontium titanate) films, $SrTiO_3$ (strontium titanate) films and PZT ($PbZrTIO_3$) films.

When a dielectric thin film is formed by a CVD apparatus, a metal organic material, such as $Ba(DPM)_2$, $Sr(DPM)_2$ or $Pb(DPM)_2$, is employed (DPM: dipivaloyl methane). Since each of the above-mentioned materials is solid in room temperatures, the material must be maintained at a hot state not lower than about 200° C. and thus maintained in a liquid state when the material in a gas state is sent by the bubbling apparatus. However, a fact is known that the raw material is quickly decomposed and allowed to deteriorate in the above-mentioned hot state.

To realize a liquid state at relatively low temperatures, a method has been developed with which the metal organic material (a solid raw material) is dissolved in an adduct (a type of a solvent) such as THF (tetrahydrofuran). If the vaporized material is sent by the bubbling apparatus, the pipe arranged from the bubbling apparatus to the processing chamber must be maintained at 200° C. or higher to prevent condensation and liquefaction of the material. Therefore, the hot pipe state must be maintained. In this case, there arises a problem in that only the adduct, such as the THF, is decomposed and vaporized and thus a required material, such as $Sr(DPM)_2$, is condensed and fixed to the inner portion of the pipe and the like.

To solve the above-mentioned problem, research of a method has begun recently, with which a liquid raw material obtained by dissolving the above-mentioned required solid raw material in a solvent is, in the liquid state, sent, and then the raw material is heated in a vaporizer formed at the front of the processing chamber so as to be vaporized and immediately supplied to the inside portion of the processing chamber.

A CVD apparatus having the above-mentioned vaporizer has been disclosed in Unexamined Japanese Patent Publication (kokai) No. Hei 7-268634. An example of the CVD apparatus is shown in FIG. 4.

A liquid raw material 4 obtained by dissolving a required solid raw material, such as Sr(DPM)2, in a solvent, such as THF, is supplied from a liquid raw-material supply apparatus 2 to a vaporizer 8 through a liquid raw-material pipe 6 in a predetermined quantity.

The liquid raw-material supply apparatus 2 according to this example has a liquid raw-material container 42 for accommodating the liquid raw material 4, valves 44 to 47, a flow-rate adjustment unit 48 and pipes for connecting the above-mentioned elements. The liquid raw-material container 42 is, through a valve 44, supplied with an inert gas 50 for sending the liquid raw material 4 with pressure. The inert gas 50 is composed of at least a nitrogen gas or a rare gas (that is, He, Ne, Ar, Kr, Xe or Rn which is applied hereinafter). When the liquid raw material 4 is sent under pressure, the valves 44, 45 and 47 are opened and the valve 46 is closed.

The vaporizer 8 has a structure in which a gas introducing pipe 16 is connected to a vaporizing container 10. Moreover, a nozzle 14 is, coaxially with the gas introducing pipe 16, inserted into the vaporizing container 10. In addition, a heater 12 is disposed to surround the vaporizing container 10. The nozzle 14 is connected to the liquid raw-material pipe 6. The gas introducing pipe 16 is supplied with an inert gas 18 through a flow-rate adjustment unit 17. Also the inert gas 18 is composed of at least either of the nitrogen gas or the rare gas.

The liquid raw material 4 supplied to the vaporizer 8 is, at the leading end of the nozzle 14, roughly particulated by the high speed inert gas 18 flowing around the leading end. Thus, the liquid raw material 4 is dispersed and allowed to collide with a wide range of the inner wall of the vaporizing container 10 heated to temperatures not lower than 250° C. so that the liquid raw material 4 is immediately vaporized. A vaporized raw material 20 is allowed to pass through a vaporized raw-material pipe 22 and a valve 24, and then supplied to the inside portion of the processing chamber 26.

In the processing chamber 26, a holder (also called a susceptor) 36 for holding a substrate 34 on which a film will be formed and a gas diffusing plate 32 having a multiplicity of small openings and arranged to diffuse a gas introduced into the processing chamber 26 are disposed. The holder 36 and the substrate 34 disposed above the holder 36 are heated by a heating means (not shown). A vacuum exhausting unit 40 for vacuum-exhausting the inside portion of the processing chamber 26 is connected to the processing chamber 26 through a valve 38. In addition to the vaporized raw material 20, a gas 30 arranged to react with the vaporized raw material 20 is introduced into the processing chamber 26. When a thin film made of SrTiO3 is formed, the gas 30 is a mixed gas of TTIP {Ti (O-i-$C_3H_7$) and an oxide gas ($O_2$ or the like). The vaporized raw material 20 and the gas 30 are mixed in the processing chamber 26. The mixed gas is dispersed to have a uniform flow velocity by the gas diffusing plate 32, and then diffused in the processing chamber 26 vacuum-exhausted by the vacuum exhausting unit 40. Then, the mixed gas is brought into contact with the heated surface of the substrate 34. As a result of CVD reactions, a thin film made of $SrTiO_3$ or the like is formed. The mixed gas which has not been used to form the thin film is discharged to the outside through the vacuum exhausting unit 40.

The above-mentioned raw material, such as $Sr(DPM)_2$ or $Ba(DPM)_2$, is easily bonded to trace impurities, such as $H_2O$, CO, $CO_2$ or the like, and precipitated. If the environmental temperature is high, the raw material is gradually decomposed and precipitated because of variation with time. Residues of the raw material are accumulated in the vaporizer 8 (specifically, the vaporizing container 10 of the vaporizer 8 which applies hereinafter), causing a variety of problems to arise. For example, residues are fixed to the inner wall of the vaporizing container 10, causing the efficiency to vaporize the liquid raw material 4 to deteriorate or the state of fixation to become nonuniform. As a result, the vaporization becomes instable. Moreover, residues sometimes cause the nozzle 14 to be clogged. If fixed residues are separated, there is apprehension that the downstream valve or the pipe is clogged.

To prevent this, a cleaning solution (for example, nitric acid) capable of dissolving residues is used to periodically clean the inside portion of the vaporizing container 10. The exhaust gas 21 generated after the cleaning process has been performed is allowed to pass through the vaporized raw-material pipe 22 and a valve 52, and then discharged to the outside by a vacuum exhausting unit 54.

However, residues are accumulated in the processing chamber 26 (specifically, the inner wall of the processing chamber 26 and the surfaces of the gas diffusing plate 32 and the holder 36) as well as in the vaporizer 8. Separation or the like of residues results in generation of particles (dust) which adhere to the surface of the substrate 34. In this case, there arises a problem of contamination of the surface of the substrate and the like arises.

Therefore, the cleaning solution for dissolving residues has been used to sometimes clean the inside portion of the processing chamber 26. The process for cleaning the inside portion of the processing chamber 26 and that for cleaning the inside portion of the vaporizer 8 have been performed independently. Moreover, fixed residues cannot easily be removed by the cleaning solution and thus a long time is required to remove fixed residues. As a result, an excessively long time is required to complete the cleaning process. Thus, time, for which the operation of the CVD apparatus is interrupted, is elongated excessively, causing the throughput of the CVD apparatus (processing performance per unit time period) to deteriorate.

SUMMARY OF THE INVENTION

A main object of the present invention is to shorten time required to clean the vaporizer and time required to clean the processing chamber so as to shorten time for which the operation of a CVD apparatus is interrupted.

In the first aspect of the present invention, a method of cleaning a CVD apparatus having a vaporizer for vaporizing a liquid raw material by applying heat and a processing chamber for forming a thin film on a substrate by a CVD method by using the raw material vaporized by said vaporizer, comprises the steps of: introducing a cleaning solution for dissolving residues generated in said vaporizer and said processing chamber into said vaporizer and heating the cleaning solution so as to vaporize the cleaning solution while removing residues in the vaporizer; and introducing an exhaust gas containing the components of the cleaning solution supplied from said vaporizer to the inside portion of said processing chamber so as to remove residues in said processing chamber.

In the second aspect of the present invention, a method of cleaning a CVD apparatus having a vaporizer for vaporizing a liquid raw material by applying heat and a processing chamber for forming a thin film on a substrate by a CVD method by using the raw material vaporized by said vaporizer, comprises the steps of: introducing a cleaning solution for dissolving residues generated in said vaporizer and said processing chamber into said vaporizer in such a manner that the cleaning solution is in a vaporized state so as to remove residues in said vaporizer; and introducing an exhaust gas containing the components of the cleaning solution supplied from said vaporizer into said processing chamber so as to remove residues in said processing chamber.

In the third aspect of the present invention, in the method of cleaning a CVD apparatus according to the second aspect, said vaporizer is heated when residues are removed.

In the fourth aspect of the present invention, in a method of cleaning a CVD apparatus according to any one of the first to third aspect of the present invention, the exhaust gas introduced into said processing chamber is used to generate plasma when residues are removed.

In the fifth aspect of the present invention, in the method of cleaning a CVD apparatus according to the forth aspect, an inert gas composed of at least either or a nitrogen gas or a rare gas is introduced into said processing chamber when residues are removed so that the pressure in the gas in said processing chamber is controlled.

In the sixth aspect of the present invention, in an apparatus for vaporizing a liquid raw material comprising: a vaporizing container into which a liquid raw material is introduced and which is made of a conductive material; a heater for heating said vaporizing container to vaporize liquid introduced into said vaporizing container; cleaning-solution supply means for supplying, to the inside portion of said vaporizing container, a cleaning solution for solving residues generated in said vaporizing container; electrode means disposed in said vaporizing container in such a manner that said electrode means is electrically insulated from said vaporizing container; and a plasma generating power source for supplying high-frequency electric power or pulse voltage to a position between said electrode means and said vaporizing container to generate plasma in said vaporizing container by using the vaporized cleaning solution.

In the seventh aspect of the present invention, the apparatus comprises the same structure of the apparatus of the sixth aspect, and has gas supply means in place of the cleaning-solution supply means. The gas supply means for supplying an inert gas composed of at least either of a nitrogen gas or a rare gas to the inside portion of said vaporizing container.

In the eighth aspect of the present invention, the apparatus comprises the same structure of the apparatus of the sixth aspect and also comprises the gas supply means according to the seventh aspect.

In the ninth aspect of the present invention, in the six to eighth aspect of the present invention, said cleaning-solution supply means supplies, to the inside portion of said vaporizing container, the cleaning solution in a vaporized state.

In the tenth aspect of the present invention, the six to tenth aspect of the present invention further comprises a direct-current power source for applying negative direct-current bias voltage to either of said vaporizing container or said electrode means.

In the eleventh aspect of the present invention, an apparatus for vaporizing a liquid raw material according to six to eleventh aspect of the present invention, comprises magnetic-field forming means for forming a magnetic field which is perpendicular to an electric field generated by said plasma generating power.

In the twelfth aspect of the present invention, a method of cleaning a CVD apparatus incorporating an apparatus for vaporizing a liquid raw material according to sixth to twelfth aspect of the present invention and a processing chamber for forming a thin film on a substrate by a CVD method by using the raw material vaporized in said vaporizing apparatus, comprises the steps of: introducing an exhaust gas generated after residues in said vaporizing container have been removed by using the plasma while the inside portion of said processing chamber is vacuum-exhausted; and generating plasma in said processing chamber by using the exhaust gas so that residues in said processing chamber are removed simultaneously with performing removal of residues in said vaporizing container.

In the thirteenth aspect of the present invention, in a method of cleaning a CVD apparatus according to the thirteenth aspect of the present invention, at least either of the vaporized cleaning solution for solving residues generated in said processing chamber or the inert gas is furthermore introduced into said processing chamber when plasma is generated in said processing chamber by using the exhaust gas.

The first aspect of the present invention is able to simultaneously perform removal of residues in the vaporizer by using the cleaning solution and removal of residues in the processing chamber by using the exhaust gas containing the components of the cleaning solution. Therefore, total time required to clean the vaporizer and the processing chamber can be shortened. Thus, time for which the operation of the CVD apparatus is interrupted can be shortened. As a result, the throughput of the CVD apparatus can be improved. Moreover, the same cleaning solution can be used in the processes for cleaning the vaporizer and the processing chamber. Therefore, the cleaning solution can be saved and an economical effect can be improved.

The second aspect of the present invention has the structure that the cleaning solution in the vaporized state is introduced into the vaporizer. Therefore, heating in the vaporizer required when the cleaning process is performed can be omitted.

The third aspect of the present invention is structured in such a manner that the cleaning solution in the vaporized state is introduced into the vaporizer and heating of the vaporizer is also performed. Therefore, the effect of the cleaning solution to dissolve residues can be enhanced. As a result, the effect of removing residues in the vaporizer can furthermore be improved.

The fourth aspect of the present invention is structured in such a manner that plasma is generated by using the exhaust gas to generate active species of the components of the cleaning solution in the processing chamber. Therefore, the etching effect and the sputtering effect of the active species enable residues fixed to the inside portion of the processing chamber to furthermore effectively be removed.

The fifth aspect of the present invention is able to easily realize gas pressure suitable to generate plasma in the processing chamber. Since the inert gas is formed into plasma in the processing chamber, the synergistic effect of the sputtering effect caused by ions in the inert gas plasma and the etching effect and the sputtering effect of the active species of the components of the cleaning solution enables residues fixed to the inside portion of the processing chamber to furthermore effectively be removed in a shorter time.

The sixth aspect of the present invention is able to generate plasma in the vaporizing container by using the vaporized cleaning solution. Since plasma is generated, the active species of the components of the cleaning solution can be generated. Thus, the etching effect and sputtering effect of the active species enables residues fixed to the inside portion of the vaporizing container to effectively be removed in a short time.

The seventh aspect of the present invention is able to generate plasma by using the inert gas. Therefore, the sputtering effect of ions in the plasma enables residues fixed to the inside portion of the vaporizing container to effectively be removed in a short time.

The eighth aspect of the present invention is able to generate plasma by using the vaporized cleaning solution and the inert gas. Therefore, the synergistic effect of the etching effect and sputtering effect of the active species of the cleaning solution and the sputtering effect of ions of the inert gas enables residues fixed to the inside portion of the vaporizing container to furthermore effectively be removed in a shorter time.

The ninth aspect of the present invention is able to supply the cleaning solution in a vaporized state to the inside portion of the vaporizing container. Therefore, the gas pressure in the vaporizing container can easily be adjusted to a level suitable to generate plasma as compared with the structure in which a liquid cleaning solution is heated and vaporized in the vaporizing container.

The tenth aspect of the present invention is able to apply negative direct-current bias voltage to either of the vaporizing container or the electrode means. Since the sputtering and etching effect of the element applied with the negative bias voltage can be enhanced, residues fixed to the element applied with the negative bias voltage can mainly be removed.

The eleventh aspect of the present invention is able to efficiently confine plasma within the vaporizing container by dint of the coaxial magnetron discharge. Therefore, the speed at which residues in the vaporizing container are removed can furthermore be raised.

The twelfth aspect of the present invention is able to effectively remove residues fixed to the inside portion of the processing chamber in a short time by using plasma simultaneously with removal of residues fixed to the inside portion of the vaporizing container. Therefore, time required to clean a CVD apparatus can significantly be shortened.

The thirteenth aspect of the present invention is able to easily maintain the gas pressure in the processing chamber at a level suitable to generate plasma. Therefore, residues in both of the vaporizing container and the processing chamber can furthermore effectively be removed.

PREFERRED EMBODIMENTS OF THE INVENTION

Preferred embodiments of the present invention will be described as follows referring to the accompanying drawings.

Figure 1:
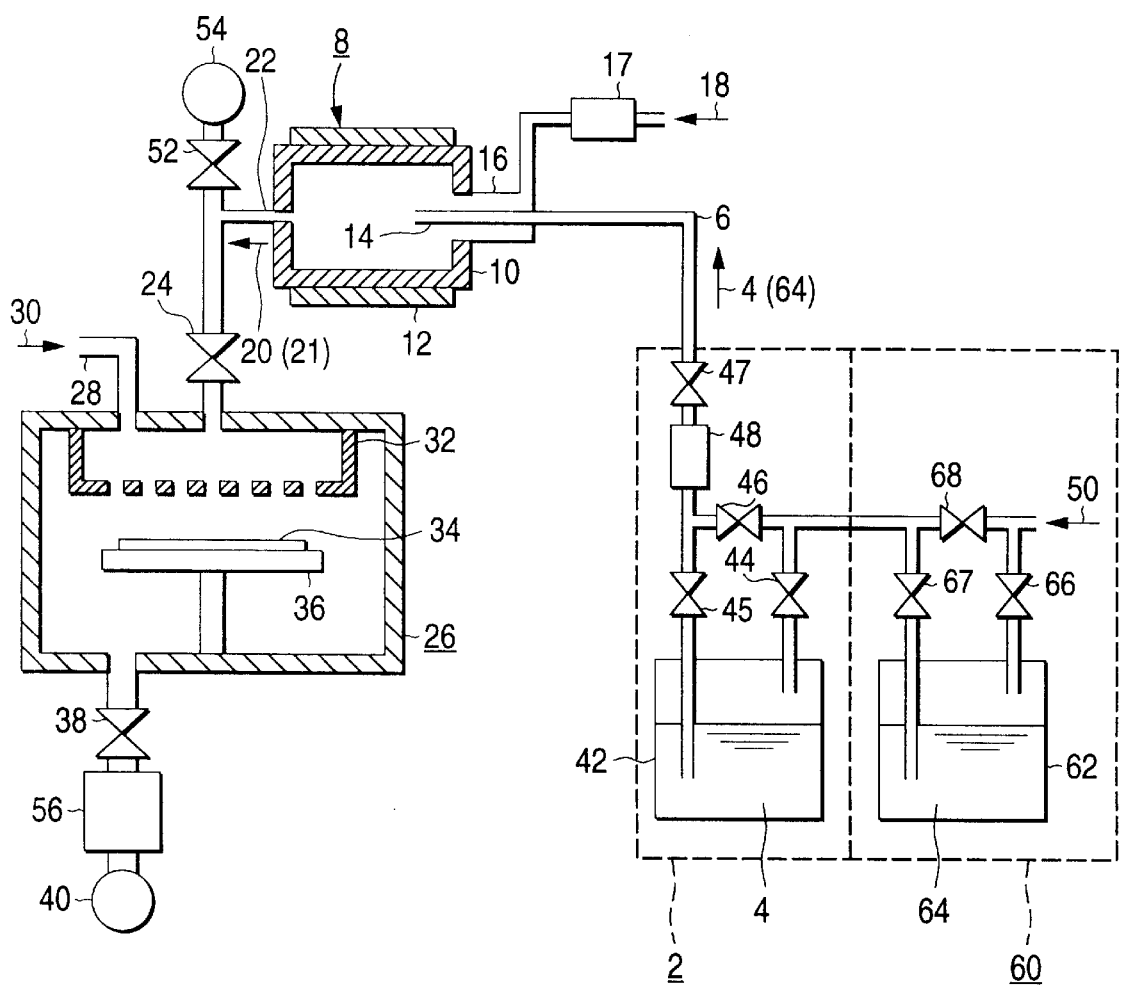
FIG. 1 is a diagram showing a first embodiment of a CVD apparatus in which a cleaning method according to the present invention is performed.
Figure 4:
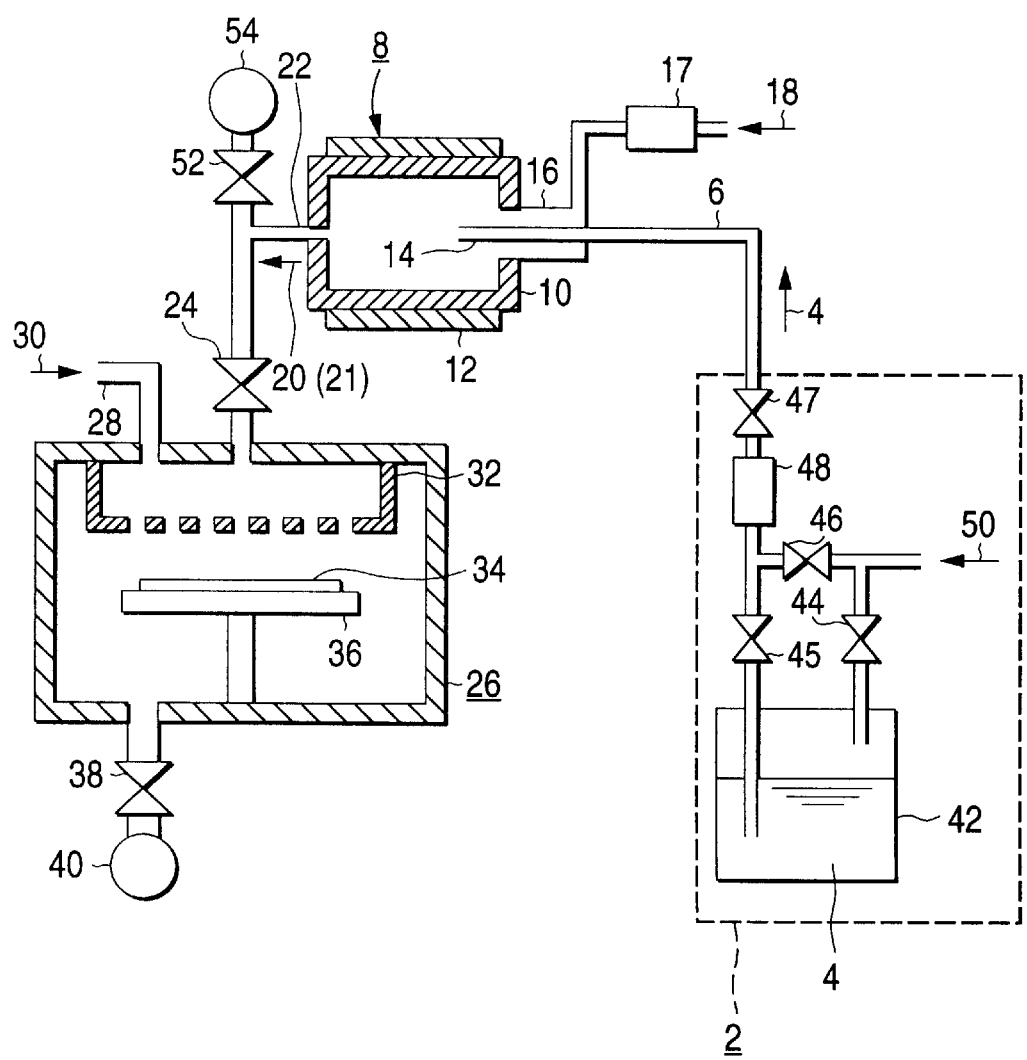
FIG. 4 is a diagram showing an example of a conventional CVD apparatus.

FIG. 1 is a diagram showing an example of a CVD apparatus in which a cleaning method according to the present invention is performed. The same elements as those of the conventional example shown in FIG. 4 are given the same reference numerals. Description will be performed mainly about the different portions from the conventional example.

In this embodiment, the vaporizer 8, more specifically, the vaporizing container 10 includes a cleaning-solution supply unit 60 for supplying a cleaning solution 64 for dissolving residues generated in the vaporizing container 10 and the processing chamber 26.

The cleaning-solution supply unit 60 according to this embodiment has a cleaning-solution container 62 for accommodating the cleaning solution 64, valves 66 to 68 and pipes for connecting the above-mentioned element to one another. The cleaning-solution container 62 is supplied with the above-mentioned inert gas 50 for sending the cleaning solution 64 with pressure. The cleaning solution 64 supplied from the cleaning-solution supply unit 60 is, in this embodiment, allowed to pass through a liquid raw-material supply unit 2, and then supplied to the inside portion of the vaporizing container 10 by (also) using the liquid raw-material pipe 6 and the nozzle 14. The cleaning solution 64 is, for example, made of, $HNO_3$ (nitric acid), $HNO_2$ (nitrous acid), $H_2O_2$ (hydrogen peroxide), $HCl$ (hydrogen chloride), $HF$ (hydrogen fluoride) or the like.

When a film is formed, the valves 68, 44, 45, 47 and 24 are opened, the valves 66, 67, 46 and 52 are closed so that the inert gas 50 is used to send the liquid raw material 4 with pressure from the liquid raw-material supply unit 2. While the flow-rate adjustment unit 48 controls the flow rate of the liquid raw material 4, the liquid raw material 4 is supplied to the inside portion of the vaporizing container 10 through the nozzle 14. Then, a process similar to the process which is performed by the conventional example shown in FIG. 4 is performed so that a required thin film is formed on the substrate 34.

If residues are accumulated in the vaporizing container 10 for the vaporizer 8 and/or the processing chamber 26 and a cleaning operation is required, it is preferable that the valves 47 and 24 are closed and the valve 52 is opened. Thus, the vacuum exhausting unit 54 is operated to exhaust the inside portion of the vaporizing container 10. Then, the valves 52, 44, 45 and 68 are closed and the valves 24, 47, 46, 66 and 67 are opened. Thus, the cleaning solution 64 is, by the inert gas 50 and under pressure, sent from the cleaning-solution supply unit 60. While the flow-rate adjustment unit 48 controls the flow rate of the cleaning solution 64, the cleaning solution 64 is introduced into the vaporizing container 10 through the liquid raw-material pipe 6 and the nozzle 14.

Simultaneously, the vaporizing container 10 is heated by the heater 12 to a level not lower than the vaporizing temperature for the cleaning solution 64. As a result, the cleaning solution 64 in the vaporizing container 10 is vaporized while the cleaning solution 64 removes residues fixed to the inner wall of the vaporizing container 10 and the nozzle 14.

The exhaust gas 21 supplied from the vaporizer 8 and generated after the cleaning process has been performed is allowed to pass through the vaporized raw-material pipe 22 and the valve 24, and then introduced into the processing chamber 26. Specifically, the exhaust gas 21 is introduced into the processing chamber 26 by the vacuum exhausting unit 40. The exhaust gas 21 contains the components of the cleaning solution in a large quantity which is the remainder in the process for cleaning the inside portion of the vaporizer 8. The exhaust gas 21 introduced into the processing chamber 26 is allowed to pass through the gas diffusion plate 32 so as to be diffused in the processing chamber 26. Then, the exhaust gas 21 removes residues in the processing chamber 26, specifically, the inner wall of the processing chamber 26, the gas diffusion plate 32 and the holder 36.

The exhaust gas 21 after the cleaning process has been performed is allowed to pass through the valve 38. Moreover, the trapping unit 56 traps and adsorbs the components of the cleaning solution and the components of residues so as to make the components to be harmless. Then, the exhaust gas 21 is discharged to the outside by the vacuum exhausting unit 40. The trapping unit 56 may be provided arbitrarily because it is not an essential portion of the present invention.

The cleaning method according to this embodiment is able to simultaneously remove residues in the vaporizer 8 by using the cleaning solution 64 and remove residues in the processing chamber 26 by using the exhaust gas 21 containing the components of the cleaning-solution. Therefore, total time required to clean the vaporizer 8 and the processing chamber 26 can be shortened. Thus, time for which the operation of the CVD apparatus is interrupted can be shortened. As a result, the throughput of the CVD apparatus can be improved.

Since the same cleaning solution 64 can be used to clean both of the vaporizer 8 and the processing chamber 26 (that is, two times), the cleaning solution 64 can be saved and an economical effect can be obtained as compared with a method in which the vaporizer 8 and the processing chamber 26 are independently cleaned.

Figure 2:
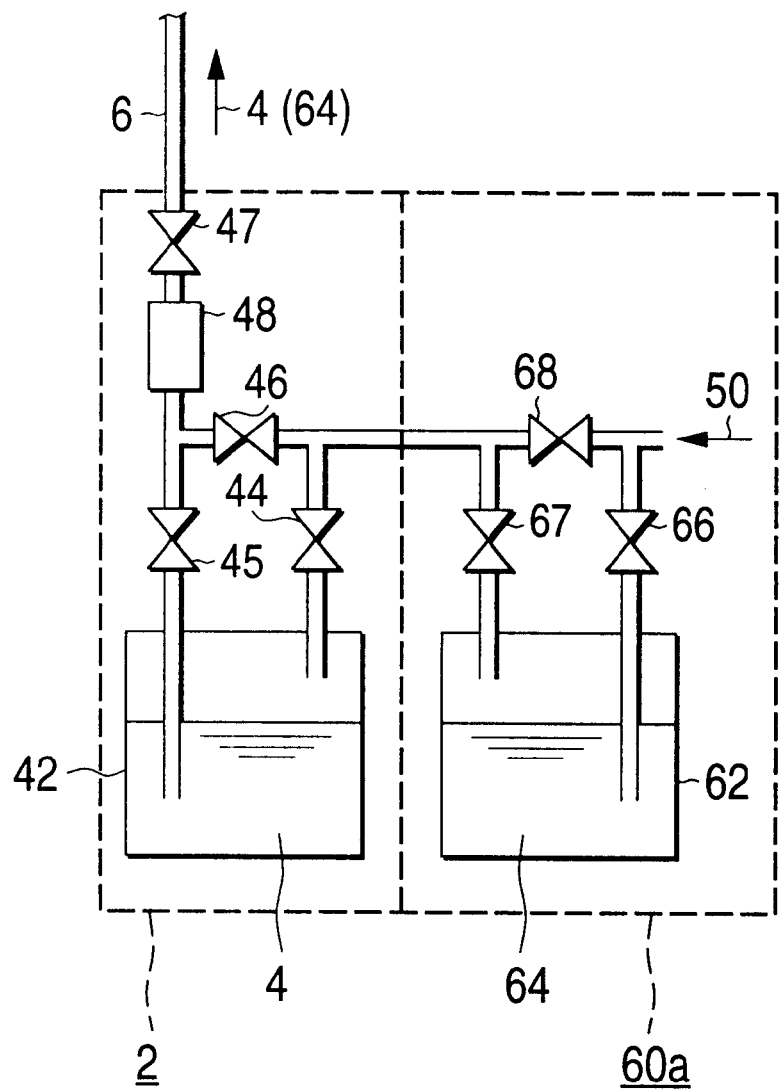
FIG. 2 is a diagram showing an example of a cleaning-solution supply unit for supplying a cleaning solution in a vaporized state.

The cleaning solution 64 in a vaporized state may be introduced into the vaporizer 8. In this case, a cleaning-solution supply unit 60a structured, for example, as shown in FIG. 2 may be employed as an alternative to the cleaning-solution supply unit 60.

The cleaning-solution supply apparatus 60a is a so-called bubbler or a bubbling apparatus which blows up the inert gas 50 into the cleaning solution 64 through the valve 66 so that air bubbles are generated in the cleaning solution 64. Thus, evaporation of the cleaning solution 64 is enhanced so that the cleaning solution 64 is, in the vaporized state, sent. When the vaporizing process is performed, the valves 66, 67, 46 and 47 are opened and the valves 68, 44 and 45 are closed. Thus, the cleaning solution 64 in the vaporized state is supplied to the vaporizing container 10 through the liquid raw-material pipe 6.

When the cleaning solution 64 in the vaporized state is introduced into the vaporizer 8, heating in the vaporizer 8 by dint of the heater 12 required when the cleaning process is performed can be omitted. If heating by dint of the heater 12 is simultaneously employed, the effect of the cleaning solution 64 to dissolve residues can be enhanced so that effect of removing residues in the vaporizer 8 is furthermore improved.

When the cleaning process is performed, the exhaust gas 21 introduced into the processing chamber 26 may be used in the processing chamber 26 to generate plasma. An example of a structure in this case is shown in FIG. 3.

Figure 3:
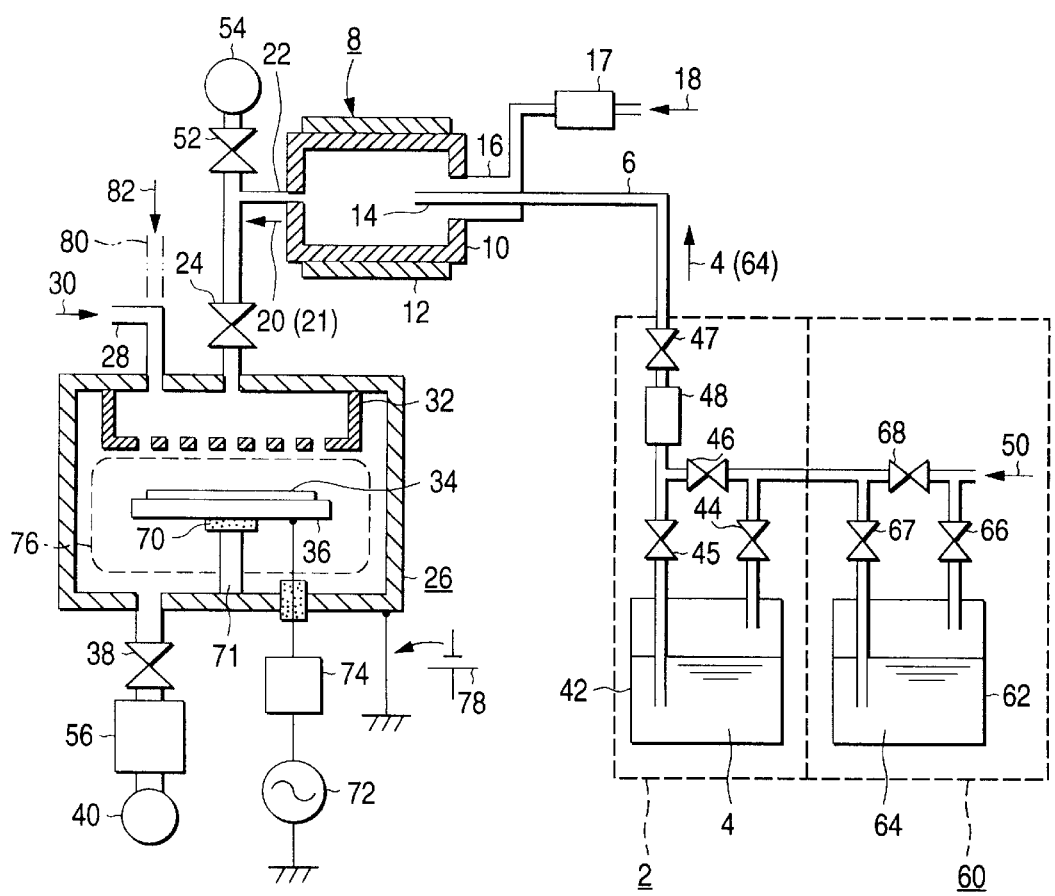
FIG. 3 is a diagram showing a second embodiment of the CVD apparatus in which the cleaning method according to the present invention is performed.

The example shown in FIG. 3 has the structure that the portion between the holder 36 and a support column 71 for the holder 36 is electrically insulated by an insulating member 70. Moreover, a high-frequency power source 72 serving as a plasma generating power source is connected between the holder 36 and the aligning circuit 74 through an aligning circuit 74. The processing chamber 26 and the gas diffusion plate 32 electrically connected to the processing chamber 26 are grounded. As a result of the above-mentioned structure, high-frequency discharge takes place between the holder 36, the processing chamber 26 and the gas diffusion plate 32. As a result, plasma 76 containing the components of the cleaning solution is generated in the processing chamber 26.

Since the plasma 76 is generated, the components of the cleaning solution is dissociated or electrically dissociated so that active species of the components are generated. Etching effects of the active species and sputtering effects caused by the active species enable residues fixed to the inside portion of the processing chamber 26, more specifically, to the inner wall of the processing chamber 26, the gas diffusionplate 32 and the holder 36 to furthermore effectively be removed.

The method of supplying high-frequency electric power from the high-frequency power source 72 may be another method except for that shown in FIG. 3. For example, a structure may be employed in which the gas diffusing plate 32 is electrically insulated from the processing chamber 26. Moreover, the high-frequency power source 72 is connected to the gas diffusing plate 32 through the aligning circuit 74 so as to supply electric power from the high-frequency power source 72. In this case, the processing chamber 26 and the holder 36 are grounded. Also in this case, the plasma 76 is generated by dint of the high-frequency discharge occurring between the gas diffusion plate 32, the processing chamber 26 and the holder 36. As a result, residues in the processing chamber 26 can be removed.

A direct-current bias power source for applying negative direct-current bias voltage to the elements among the processing chamber 26, the gas diffusion plate 32 and the holder 36 may be provided. Thus, positive ions in the plasma 76 are attracted by the negative bias voltage. Therefore, residues of the element applied with the negative bias voltage can mainly be removed. For example as shown in FIG. 3, a direct-current bias power source 78 is, in series, inserted into the ground line of the processing chamber 26 in such a manner that the processing chamber 26 is made to be the negative pole. Thus, the wall surface of the processing chamber 26 is biased to negative potentials. Therefore, positive ions in the plasma 76 can be attracted to the wall surface of the processing chamber 26 so that residues of the wall surface are mainly removed.

An example structure in which a gas introducing pipe 80 is connected to the gas introducing pipe 28 may be employed to introduce an inert gas 82 composed of at least the nitrogen gas or the rare gas into the processing chamber 26 in order to control the gas pressure in the processing chamber 26. If gas pressure (for example, about $10^{-1}$ Torr to about 10 Torr) suitable to generate plasma in the processing chamber 26 cannot easily be realized by only the exhaust gas 21, the suitable gas pressure can easily be-realized by dint of the inert gas 82. Moreover, the inert gas 82 is formed into plasma in the processing chamber 26. A synergistic effect of the sputtering effect of ions in the inert gas plasma, the etching effect and sputtering effect of the active species of the components of the cleaning solution in the exhaust gas 21 enables residues in the processing chamber 26 to furthermore effectively be removed in a shorter time. It is preferable that a rare gas, such as an Ar gas or a Xe gas, is employed as the inert gas 82.

Figure 5:
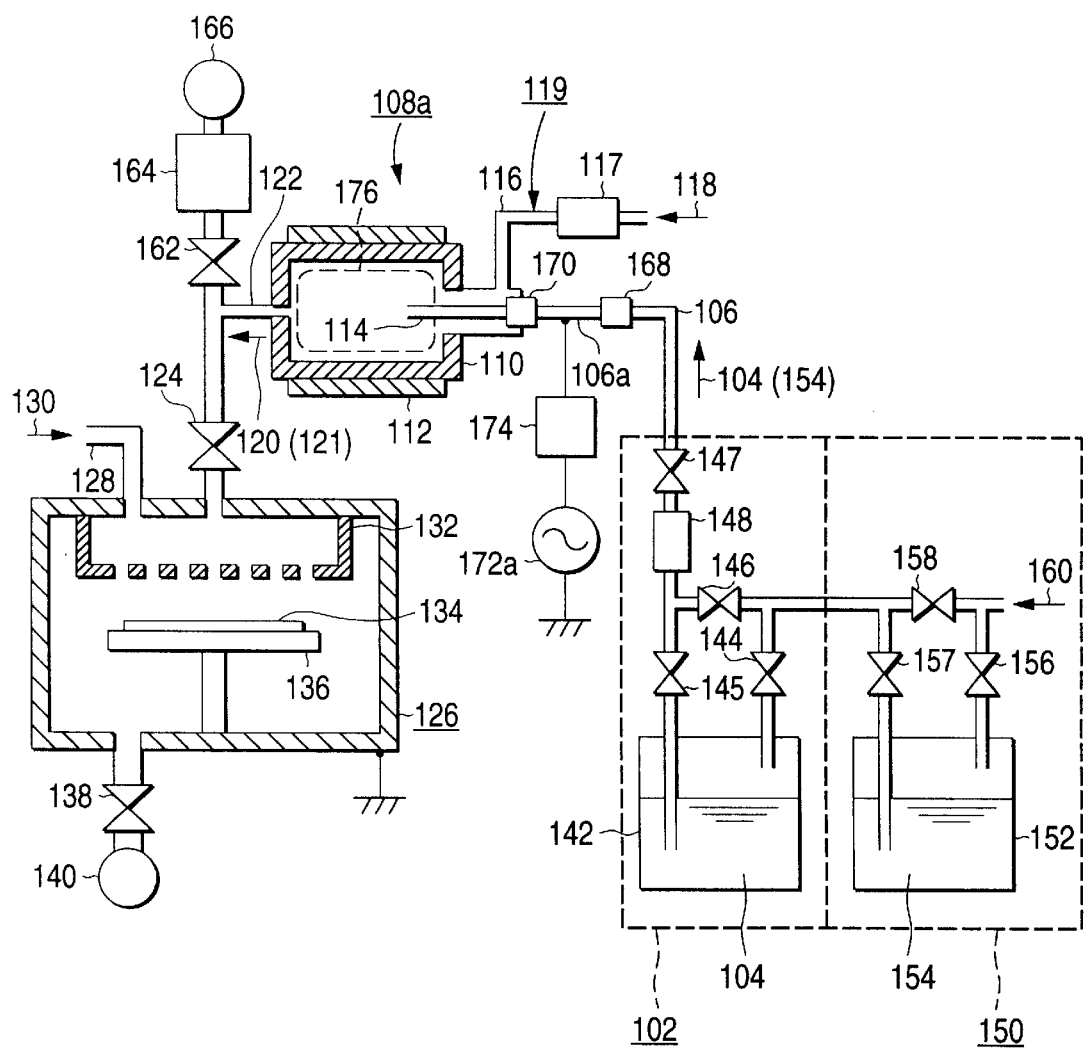
FIG. 5 is a diagram showing a third embodiment of a CVD apparatus having a vaporizing apparatus according to the present invention.
Figure 6:
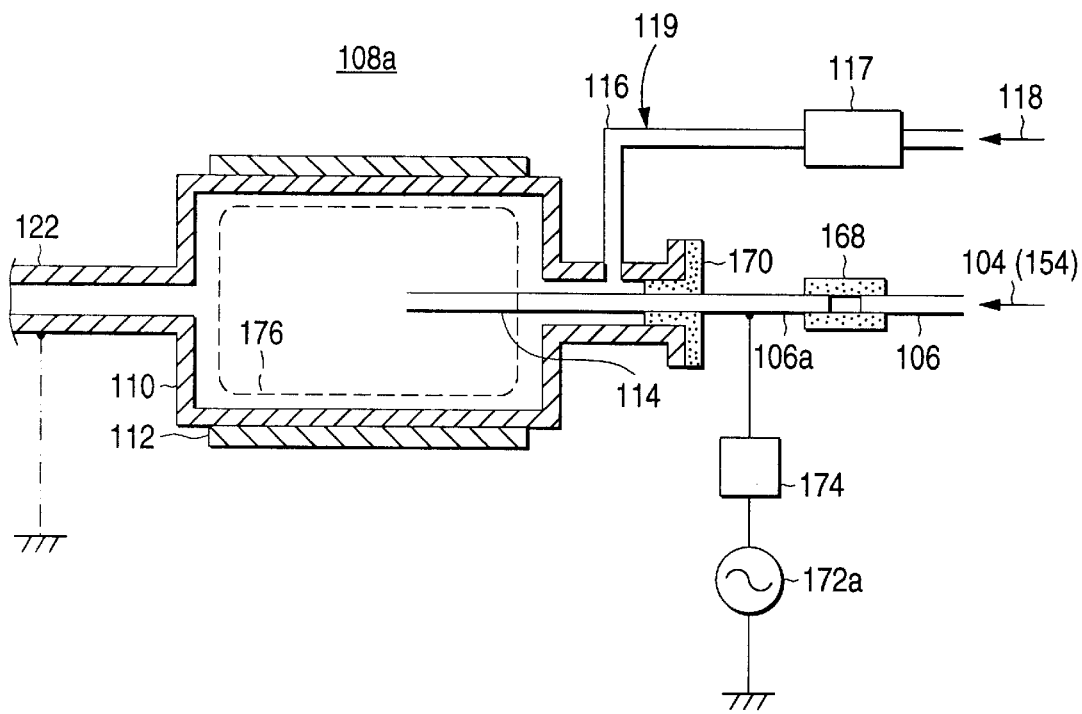
FIG. 6 is a diagram showing an example of a portion in the vicinity of the vaporizing apparatus shown in FIG. 5.
Figure 7:
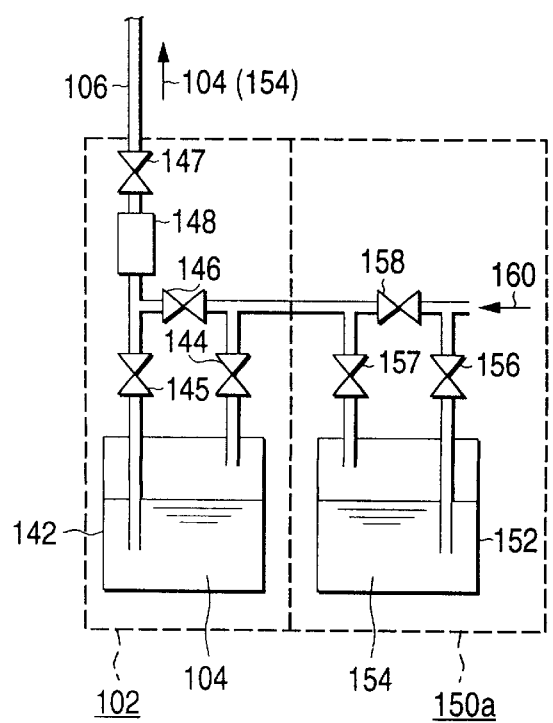
FIG. 7 is a diagram showing an example of a cleaning-solution supply apparatus for supplying a cleaning solution in a vaporized state.

FIG. 5 is a diagram showing an example of a CVD apparatus having the vaporizing apparatus according to the present invention. FIG. 6 is a diagram showing an example of a portion in the vicinity of the vaporizing apparatus shown in FIG. 5.

In this embodiment, a vaporizing apparatus 8a is provided.

The vaporizing apparatus 108a has a vaporizing container 110 into which the liquid raw material 104 is supplied from the above-mentioned liquid raw-material supply apparatus 102 through the liquid raw-material pipe 106 and the nozzle 114 made of a conductive material, specifically, metal. Moreover, the vaporizing apparatus 108a has a heater 112 disposed around the vaporizing container 110 and arranged to heat the vaporizing container 110 so as to vaporize the liquid raw material 104 introduced into the vaporizing container 110 and a cleaning solution 154 to be described later. The heater 112 is, for example, an electric heater. The above-mentioned vaporized raw-material pipe 122 for supplying a vaporized raw material 120 to a processing chamber 126 is connected to the vaporizing container 110.

Moreover, the vaporizing apparatus 108a has a cleaning-solution supply apparatus 150 for supplying, to the inside portion of the vaporizing container 110, a cleaning solution 154 which is capable of dissolving residues generated in the vaporizing container 110. In addition, the vaporizing apparatus 108a has a gas supply means 119 for supplying, to the inside portion of the vaporizing container 110, an inert gas 118 composed of at least either of a nitrogen gas or a rare gas (that is, He, Ne, Ar, Kr, Xe or Re hereinafter applied).

In this embodiment, the gas supply means 119 has the above-mentioned gas introducing pipe 116 and a flow-rate adjustment unit 117 for causing the inert gas 118 to flow around the nozzle 114.

The cleaning-solution supply apparatus 150 has a cleaning-solution container 152 for accommodating the cleaning solution 154, valves 156 to 158 and pipes for connecting the foregoing elements. An inert gas 160 for moving the cleaning solution 154 with pressure is supplied to the cleaning-solution container 152. The inert gas 160 is composed of at least either of a nitrogen gas or a rare gas. The cleaning solution 154 is supplied from the cleaning-solution supply apparatus 150 to the inside portion of the vaporizing container 110 through the liquid raw-material supply apparatus 102, the liquid raw-material pipe 106 and the nozzle 114 (also serving as a passage). The cleaning solution 154 is made of, for example, $HNO_3$ (nitric acid), $HNO_2$ (nitrous acid), $H_2O_2$ (hydrogen peroxide), HCl (hydrogen chloride), HF (hydrogen fluoride) or the like.

In this embodiment, the liquid raw-material supply apparatus 102 has a liquid raw-material container 142 for accommodating the liquid raw material 104, valves 144 to 147, a flow-rate adjustment unit 148 and pipes for connecting the foregoing elements. A line arranged between valves 144 and 146 is supplied with the inert gas 160 supplied from the cleaning-solution supply apparatus 50.

The nozzle 114 is inserted into the vaporizing container 110 through a hollow insulating member 170. The insulating member 170 electrically insulates a portion between the vaporizing container 110 and the nozzle 114. The nozzle 114 is made of a conductive material, specifically metal. In this embodiment, the nozzle 114 forms an electrode means.

The liquid raw-material pipe 106 is electrically insulated at a position adjacent to the vaporizing container 110 by a hollow insulating-member 168. A plasma generating power source 172a is, through an aligning circuit 174, connected to a position between the liquid raw-material pipe 6a connected to the nozzle 114 and an earth. In this embodiment, the plasma generating power source 172a is a high-frequency power source for producing an output of high-frequency electric power of 13.56 MHz. The vaporizing container 110 according to this embodiment is electrically connected to the processing chamber 126 through the above-mentioned vaporized raw-material pipe 122 and the valve 124. The processing chamber 126 is grounded. Therefore, high-frequency electric power can be supplied from the plasma generating power source 172a to a position between the nozzle 114 serving as the electrode means and the vaporizing container 110.

In a usual case, sealing packings are each disposed between the insulating member 170 and the vaporizing container 110 which is disposed in contact with the insulating member 170 and between the insulating member 170 and the liquid raw-material pipe 106a. The sealing packings are omitted from illustration. Also sealing packings for the insulating member 168 and insulating members 178 and 180 are omitted from illustration.

Referring to FIG. 5, an exhaust unit 66 for exhausting the inside portion of the vaporizing container 110 and a trapping unit 164 for trapping and adsorbing a predetermined component in an exhaust gas 121 supplied from the vaporizing container 110 are connected to the vaporized raw-material pipe 122 through a valve 162. The trapping unit 164 may be provided arbitrarily because it is not an essential portion of the present invention. The foregoing also applies to the example shown in FIG. 12.

In the processing chamber 126, a holder (also called a susceptor) 136 for holding a substrate 134 on which a film will be formed and a gas diffusing plate 132 having a multiplicity of small openings and arranged to diffuse a gas introduced into the processing chamber 126 are disposed. The holder 136 and the substrate 134 disposed above the holder 136 are heated by a heating means (not shown). A vacuum exhausting unit 140 for vacuum-exhausting the inside portion of the processing chamber 126 is connected to the processing chamber 126 through a valve 138. In addition to the vaporized raw material 120, a gas 130 arranged to react with the vaporized raw material 120 is introduced into the processing chamber 126 through a flow-rate adjustment unit (not shown). When a thin film made of $SrTiO_3$ is formed, the gas 130 is a mixed gas of TTIP and an oxide gas ($O_2$ or the like).

The operation of the CVD apparatus including the vaporizing apparatus 8a and shown in FIG. 5 will now be described. When a film is formed, the valves 158, 144, 145, 147 and 124 are opened and the valves 156, 157, 146 and 162 are closed. Thus, the liquid raw material 104 is, under pressure, sent by the inert gas 160 from the liquid raw-material supply apparatus 102. While the flow-rate adjustment unit 148 controls the flow rate of the inert gas 160, the liquid raw material 104 is supplied to the inside portion of the vaporizing container 110 through the nozzle 114.

Simultaneously, the inert gas 118 is supplied to the gas introducing pipe 116. Moreover, the vaporizing container 110 is heated to a temperature higher than the vaporization temperature for the liquid raw material 104 by the heater 112. If the liquid raw material 104 contains $Sr(DPM)_2$ or $Ba(DPM)_2$, the vaporizing container 110 is heated to a temperature not lower than about 250° C.

Thus, the liquid raw material 104 is roughly particulated and jetted out from the nozzle 114, and then dispersed and allowed to collide with a wide range of the inner wall of the vaporizing container 110 so that the liquid raw material 104 is instantaneously vaporized. The vaporized raw material 120 is allowed to pass through the vaporized raw-material pipe 122 and the valve 124, and then introduced into the processing chamber 126 by dint of the difference in the pressure. The raw material 120 and the gas 130 are mixed with each other in the processing chamber 126, a mixed gas being then dispersed to have a uniform flow velocity by the gas diffusing plate 132. Then, the mixed gas is dispersed in the processing chamber 126 which has been vacuum-exhausted by the vacuum exhausting unit 140. Then, the mixed gas is brought into contact with the surface of the heated substrate 134, and a CVD reaction takes place, so that a thin film made of $SrTiO_3$ or the like is formed on the substrate 134. A portion of the mixed gas is discharged to the outside through the vacuum exhausting unit 140.

If residues are accumulated in the vaporizing container 110 of the vaporizing apparatus 8a and cleaning must be performed, the valves 124, 144, 145 and 158 are closed and the valves 162, 147, 146, 156 and 157 are opened. Thus, the cleaning solution 154 is, with pressure, sent from the cleaning-solution supply apparatus 150 by the inert gas 160. While the flow-rate adjustment unit 148 controls the flowrate, the cleaning solution 154 is supplied to the inside portion of the vaporizing container 110 through the liquid raw-material pipe 106 and the nozzle 114. Simultaneously, the vaporizing container 110 is, by the heater 112, heated to a temperature not lower than the vaporizing temperature for the cleaning solution 154. As a result, the vaporized cleaning solution 154 having a predetermined pressure is allowed to exist in the vaporizing container 110.

When high-frequency electric power is, in the foregoing state, supplied from the plasma generating power source 172a to a position between the nozzle 114 and the vaporizing container 110. Thus, high-frequency discharge takes place between the nozzle 114 and the inner wall of the vaporizing container 110 so that plasma 176, the component of which is the vaporized cleaning solution 154, is generated.

As a result of generation of the plasma 176, the components of the cleaning solution 154 are dissociated or electrically dissociated so that active species of the cleaning solution 154 are generated. An etching effect of the active species and a sputtering effect of the active species enable residues fixed to the inside portion of the vaporizing container 110, more specifically, the inner wall of the vaporizing container 110 and the nozzle 114 to effectively be removed in a short time. As a result, the vaporizing apparatus 108a can stably be operated for a long time.

The above-mentioned exhaust gas 121 existing in the vaporizing container 110 after the cleaning operation has been performed is allowed to pass through the vaporized raw-material pipe 122 and the valve 162. In this embodiment, the components of the cleaning solution and those of residues are adsorbed and removed by the trapping unit 164 so as to be rendered harmless. Then, the components are discharged to the outside by the exhaust unit 166.

The above-mentioned inert gas 118 may be introduced into the vaporizing container 110 from the gas supply means 119 when the inside portion of the vaporizing container 110 is cleaned. If a gas pressure (for example, about $10^{-1}$ Torr to about 10 Torr) which is satisfactorily high to generate plasma in the vaporizing container 110 cannot easily be realized by only the vaporization of the cleaning solution 54, the inert gas 118 enables the satisfactorily high gas pressure to easily be realized. Moreover, the inert gas 118 is formed into plasma in the vaporizing container 110. A synergistic effect of a sputtering effect caused from ions in the inert gas plasma, an etching effect and a sputtering effect caused from active species of the components of the cleaning solution enables residues fixed to the inside portion of the vaporizing container 110 to further effectively be removed in a shorter time. In this case, it is preferable that the inert gas 118 is a rare gas of Ar, Xe or the like because the sputtering ratio can be raised.

A method may be employed in which the cleaning solution 154 is not introduced into the vaporizing container 110 and only the inert gas 18 is introduced from the gas supply means 119 so as to generate the plasma 176 by using the inert gas 118. In this case, a sputtering effect of ions in the inert gas plasma enables residues fixed to the inside portion of the vaporizing container 110 to effectively be removed in a short time.

Figure 8:
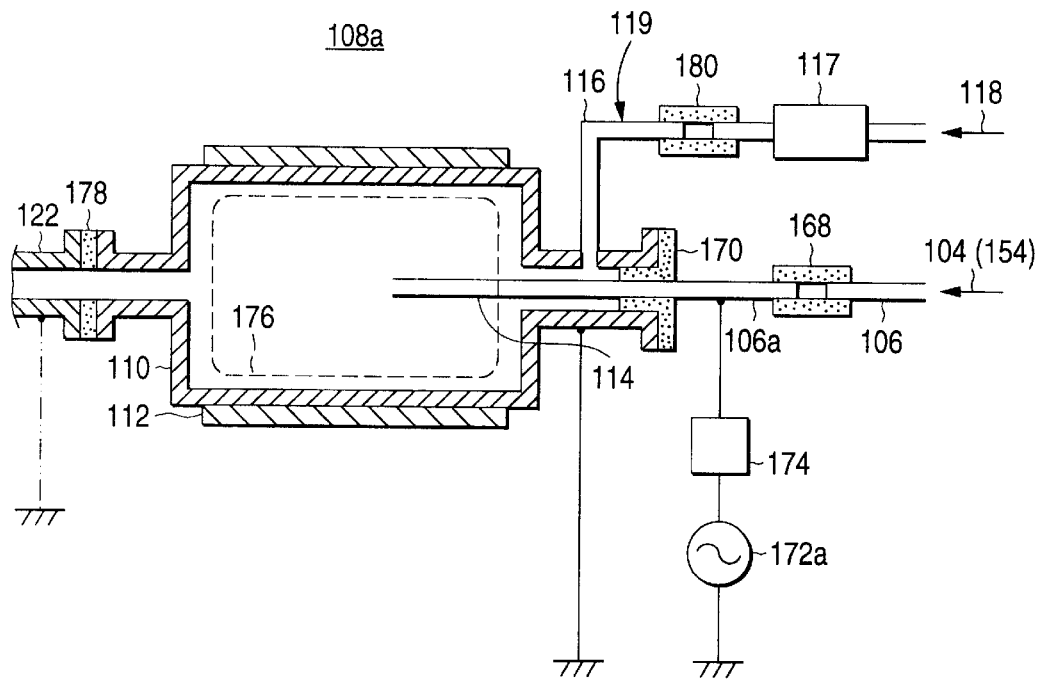
FIG. 8 is a diagram showing another example of the vaporizing apparatus.

As an alternative to the cleaning-solution supply apparatus 150, a cleaning-solution supply apparatus 150a for supplying a vaporized cleaning solution 154 may be employed, for example, as shown in FIG. 8. The cleaning-solution supply apparatus 150a is a so-called bubbler or a bubbling apparatus which blows up the inert gas 160 into the cleaning solution 154 through the valve 156 so that air bubbles are generated in the cleaning solution 154. Thus, evaporation of the cleaning solution 154 is enhanced so that the cleaning solution 154 is, in the vaporized state, sent. When the vaporization process is performed, the valves 156, 157, 146 and 147 are opened and the valves 158, 144 and 145 are closed. Thus, the cleaning solution 154 in the vaporized state is supplied to the vaporizing container 110 through the liquid raw-material pipe 106.

Since use of the above-mentioned cleaning-solution supply apparatus 150a enables the cleaning solution 154 in the vaporized state to be supplied to the vaporizing container 110, the vaporizing container 110 is not required to be heated by the heater 112 when the cleaning process is performed. Moreover, the gas pressure in the vaporizing container 110 can easily be adjusted to a level satisfactory to generate plasma as compared with the structure in which the liquid cleaning solution 154 is vaporized in the vaporizing container 110 by heating. Note that heat generated by the heater 112 may simultaneously be employed.

In the structure shown in FIGS. 5 and 6, the vaporized raw-material pipe 122, the processing chamber 126 and the gas introducing pipe 116 are electrically conducted with the vaporizing container 110. Therefore, the potentials of the foregoing elements are the same. Thus, a large loop is electrically formed in the overall portion of the apparatus. Thus, there is apprehension that supply of high-frequency electric power from the plasma generating power source 172a to a position between the nozzle 114 and the earth results in plasma being generated at a non-predicted position. In this case, an efficiency to supply high-frequency electric power to plasma 176a which is generated in the vaporizing apparatus 108 deteriorates. To prevent this, it is preferable that hollow insulating members 178 and 180 are disposed also at intermediate positions (preferably, positions adjacent to the vaporizing container 110) of the vaporized raw-material pipe 122 and the gas introducing pipe 116, for example, as shown in FIG. 8. Thus, electric insulation is realized between all of pipes and supporting members, which are connected to the vaporizing container 10, and the vaporizing container 110. Moreover, the vaporizing container 110 is reliably grounded.

Figure 9:
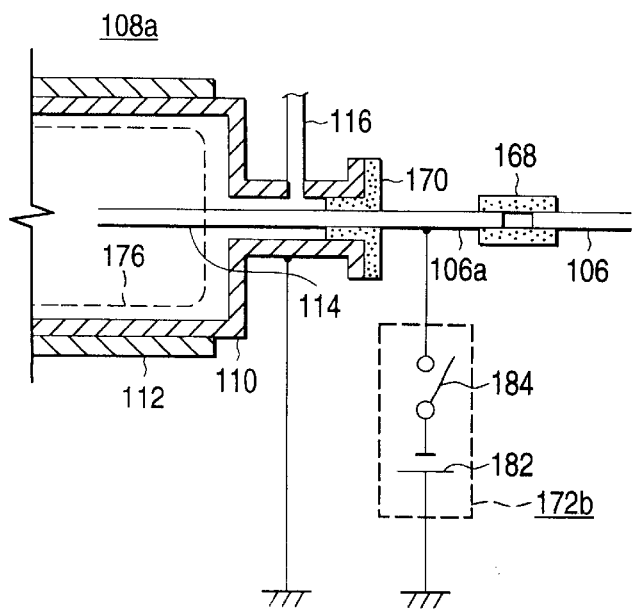
FIG. 9 is a diagram partially showing the other example of the vaporizing apparatus.

As an alternative to the plasma generating power source 172a, which is the high-frequency power source, and the aligning circuit 174, a plasma generating power source 172b for supplying pulse voltage to a position between the nozzle 114 serving as the electrode means and the vaporizing container 110 may be provided, for example, as shown in FIG. 9. The plasma generating power source 172b according to this embodiment has a direct-current power source 182 for producing an output of direct-current voltage and a switching means 184 for turning on/off (switching) the direct-current voltage supplied from the direct-current power source 182 so as to produce an output of the direct-current voltage. The level of the output voltage from the direct-current power source 182 is, for example, about 500 V to about 10 kV. The switching means 184 performs the switching operation in such a manner that the pulse width is, for example, about 1 □s to about 1 ms and the duty ratio is about 0.1% to about 10% when the switching means 184 is switched on. The pressure of the gas in the vaporizing container 110 is required to be determined substantially in accordance with Paschen's law.

The structure shown in FIG. 9 is able to generate plasma 176 in the vaporizing container 110 by dint of a high pressure pulse discharge which occurs between the nozzle 114 and the vaporizing container 110. In this case, it is preferable that the polarity of the applied pulse voltage, that is, the polarity of the direct-current power source 182 is determined in such a manner that either of the nozzle 114 or the vaporizing container 110 required to be mainly cleaned is made to be negative pole (in the illustrated structure, the nozzle 114 is made to be the negative pole). Thus, positive ions in the plasma 176 are mainly attracted to the negative-pole-side element, causing the sputter effect to be enhanced. Therefore, residues of the negative-pole-side element can mainly be removed.

Although a method may be employed in which direct-current arc discharge is caused to take place in the vaporizing container 110 to generate plasma 176, the nozzle 14 and the vaporizing container 110 are damaged excessively because of the direct-current arc discharge. Therefore, it is preferable that the above-mentioned pulse discharge be employed.

Figure 10:
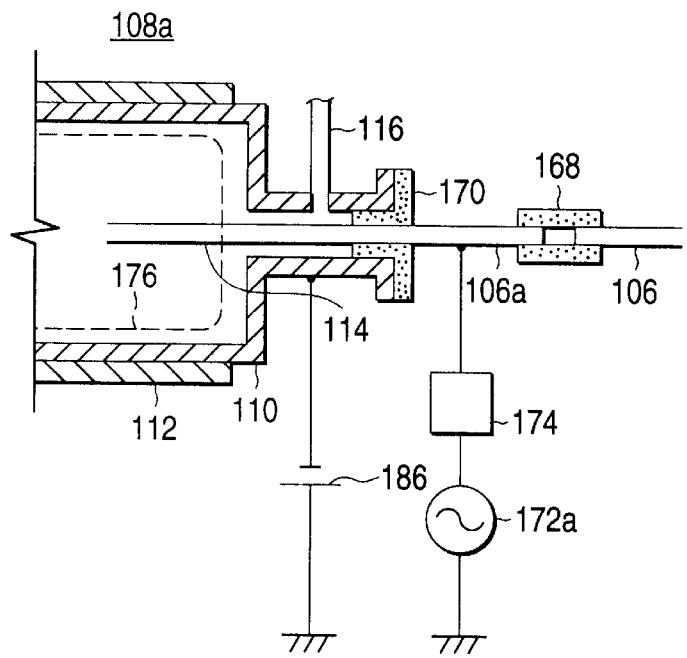
FIG. 10 is a diagram partially showing the other example of the vaporizing apparatus.

Because of the same reason, a direct-current bias power source 186 for applying negative direct-current bias voltage may be provided for either of the nozzle 114 or the vaporizing container 110, specifically an element required to mainly be cleaned (in the illustrated structure, the vaporizing container 110) as shown in the example shown in FIG. 10 when the plasma generating power source 172a which is the high-frequency power source is employed. In this case, positive ions in plasma 176 are attracted by dint of the negative bias voltage. Therefore, residues of the element applied with the negative bias voltage can mainly be removed. The direct-current bias power source 186 may be inserted in series between the vaporizing container 110 and the earth as in the example shown in FIG. 10 or may be inserted in series into the line of the plasma generating power source 172a. As can be understood from the description above, the direction of the direct-current bias power source 186 may be opposite to that shown in the drawing.

Figure 11:
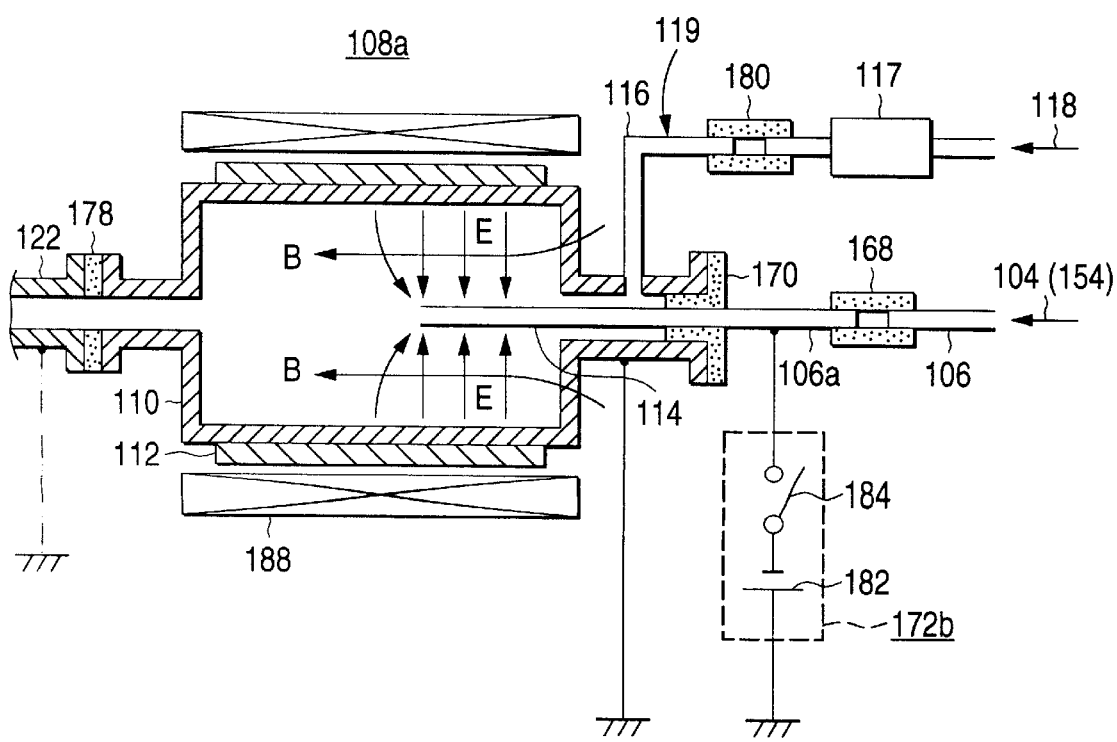
FIG. 11 is a diagram partially showing the other example of the vaporizing apparatus.

As shown in FIG. 11, a magnetic-field forming means for forming a magnetic field B which is perpendicular to electric field E generated by the plasma generating power source 172b or 172a may be provided in the vaporizing container 110. In the example shown in FIG. 11, the magnetic-field forming means is a cylindrical magnetic coil 188 disposed on the outside of the vaporizing container 110. As a result, the magnetic field B is formed in the axial direction of the vaporizing container 110, the magnetic field being perpendicular to the electric field E formed in the radial direction of the vaporizing container 110. As an alternative to the magnetic coil 188, a permanent magnet may be employed. The plasma generating power source may be the plasma generating power source 172b which produces a pulse voltage output having a shape as illustrated or the above-mentioned plasma generating power source 172a which produces a high-frequency electric power output. In the latter case, the electric field E and the magnetic field B are also perpendicular to each other in spite of a difference that-the electric field E is inverted as time elapses.

When the electric field E and the magnetic field B are made to be perpendicular to each other in the vaporizing container 110 as described above, so-called coaxial magnetron discharge enables plasma to efficiently be confined within the vaporizing container 110. Therefore, the speed at which residues in the vaporizing container 110 are removed can furthermore be raised.

Figure 13:
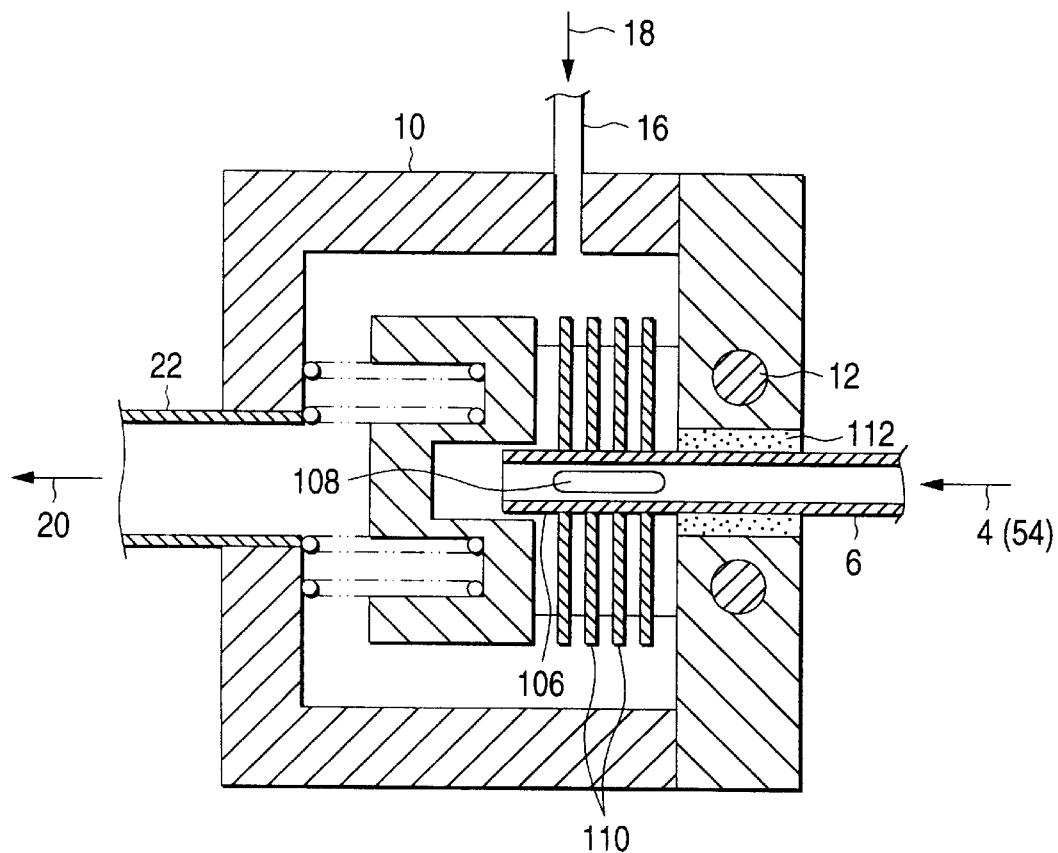
FIG. 13 is a diagram showing another example of the structure of the vaporizing apparatus portion.

The structure of the vaporizing container may be a shape formed by stacking discs, for example, as shown in FIG. 13, as well as the above-mentioned nozzle shape. A vaporizer disclosed in U.S. Pat. No. 5,361,800 has the above-mentioned structure. That is, a raw-material introducing pipe 206 connected to the liquid raw-material pipe 106 is inserted into the vaporizing container 110. A plurality of openings 208 are formed in the wall surface adjacent to the leading end of the raw-material introducing pipe 206. Moreover, a plurality of metal discs 210 are stacked around the openings 208 to form gaps. Thus, the liquid raw material 4 is extruded through the gaps so as to be discharged to the surrounding portion. The heater 112 is embedded in the vaporizing container 110 so as to heat each of the discs 110 through the vaporizing container 110, the raw-material introducing pipe 206 and the like. The liquid raw material 4 extruded from positions adjacent to the central portions of the discs 210 is heated and vaporized in the peripheral portions of the heated discs 210. The vaporized raw material 120 is allowed to pass through the vaporized raw-material pipe 122 connected to another end of the vaporizing container 110, and then discharged.

Since the above-mentioned example has the structure that the raw-material introducing pipe 206 and the plural discs 210 connected to the raw-material introducing pipe 206 serve as the electrode means, the above-mentioned elements are electrically insulated from the vaporizing container 110 and electrically connected to the vaporizing container 110 by the insulating member 212 and the like. High-frequency electric power or pulse voltage is, by the plasma generating power source 172a or 172b, supplied to the position between the raw-material introducing pipe 206, the discs 210 and the vaporizing container 110 so that plasma is generated in the vaporizing container 110 by using the liquid raw material vaporized in the inside portion. As a result, residues in the vaporizing container 210 can effectively be removed.

If the inert gas 118 is also used to clean the inside portion of the vaporizing container 110, the structure of the example shown in FIG. 13 may be arranged in such a manner that the gas introducing pipe 116 forming the gas supply means 119 is connected to the vaporizing container 110 so as to introduce the inert gas 18 into the-vaporizing container 110.

Figure 12:
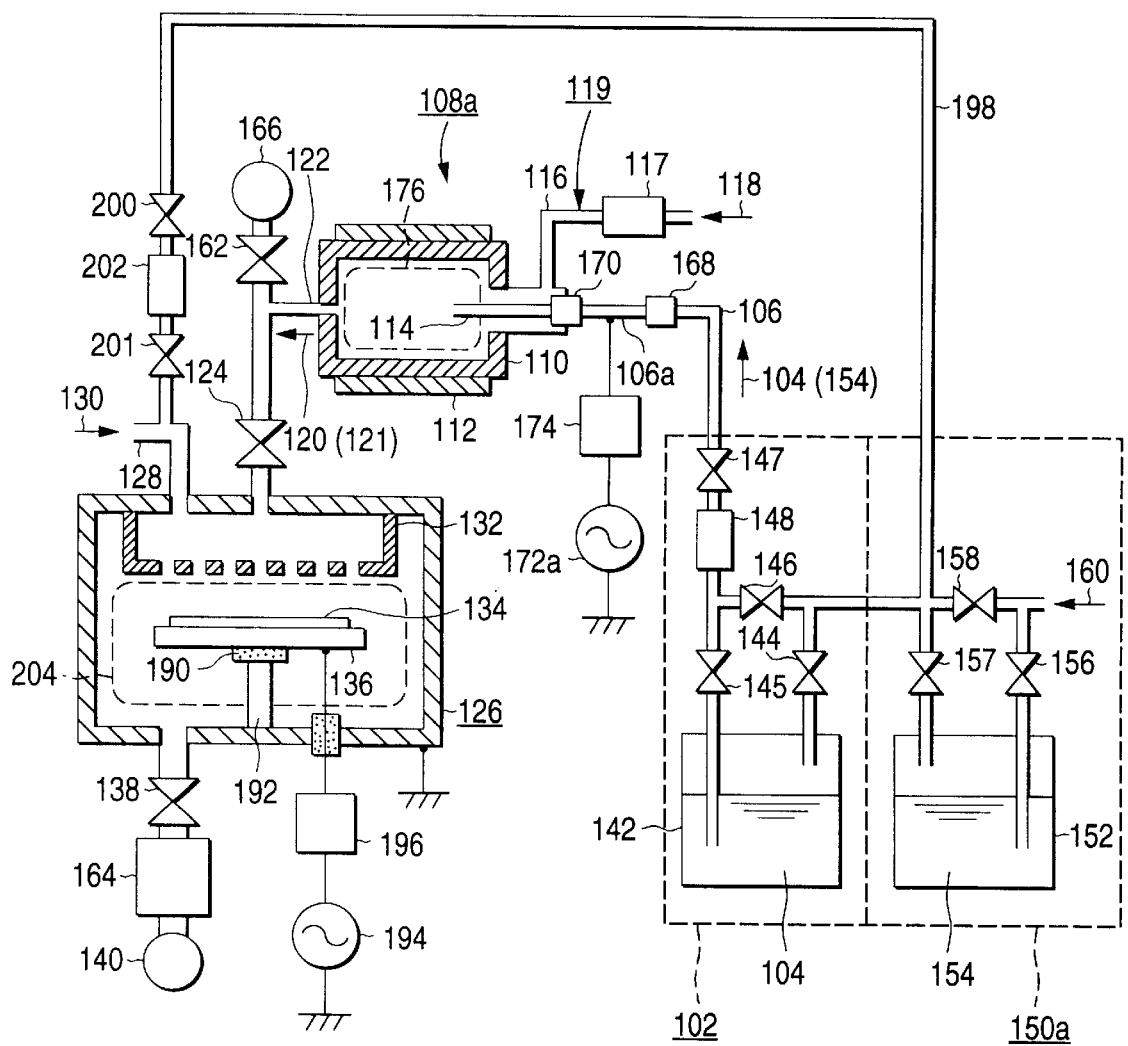
FIG. 12 is a diagram showing another example of the CVD apparatus having the vaporizing apparatus according to the present invention.

A structure and method for removing residues in the processing chamber 126 simultaneously with removal of residues in the vaporizing container 110 are shown in FIG. 12.

In this case, the valve 162 is closed and the valves 124 and 138 are opened. Thus, the exhaust gas 121 supplied from the vaporizing container 110 and generated after the cleaning process has been performed is introduced into the processing chamber 126 while the inside portion of the processing chamber 126 is vacuum exhausted by the vacuum exhausting unit 140. Moreover, the exhaust gas 121 is used to generate plasma 204 in the processing chamber 126. The plasma 204 is used to remove residues in the processing chamber 126, specifically, those fixed to the inner wall of the processing chamber 126, the gas diffusing plate 132 and the holder 136 simultaneously with the process for cleaning the inside portion of the vaporizing container 110.

That is, the exhaust gas 121 supplied from the vaporizing container 110 and generated after the cleaning process has been performs contains the components of the gas used to clean the inside portion of the vaporizing container 110, specifically the components of at least either of the vaporized cleaning solution 154 or the inert gas 118. Therefore, when the plasma 204 having the above-mentioned components of the gas is generated in the processing chamber 26, the etching effect and/or the sputtering effect caused from the plasma 204 enables residues in the processing chamber 126 to effectively be removed in a short time. When removal of residues in the vaporizing container 110 and removal of residues in the processing chamber 126 are performed as described above, time required to clean the CVD apparatus can significantly be shortened.

In the structure shown in FIG. 12, the plasma 204 is generated in the processing chamber 126 by electrically insulating the portion between the holder 136 and the support column 192 by an insulating member 190. Moreover, a high-frequency power source 194 serving as a power source for generating plasma is connected to a position between the holder 136 and the earth through an aligning circuit 196. The processing chamber 126 and the gas diffusing plate 132 electrically connected to the processing chamber 126 are grounded. As a result of the above-mentioned structure, high-frequency discharge takes place between the holder 136 and the processing chamber 126 and the gas diffusing plate 132 so that the plasma 204 is generated.

The trapping unit 164 for trapping and adsorbing the components of the cleaning solution and those of residues is, in this embodiment, disposed between the valve 138 and the vacuum exhausting unit 140. The exhaust gas after the inside portion of the processing chamber 126 has been cleaned is made to be harmless in the trapping unit 164, and then discharged to the outside by the vacuum exhausting unit 140.

The method of supplying high-frequency electric power from the high-frequency power source 194 may be another method except for that shown in FIG. 12. For example, a structure may be employed in which the gas diffusing plate 132 is electrically insulated from the processing chamber 126. Moreover, the high-frequency power source 194 is connected to the gas diffusing plate 132 through the aligning circuit 196 so as to supply electric power from the high-frequency power source 194. In this case, the processing chamber 126 is grounded. Although it is preferable that the holder 136 is grounded, it may be separated upwards from the earth. Also in this case, plasma 204 is generated in the processing chamber 126 by dint of high frequency discharge occurring between the gas diffusing plate 132 and the processing chamber 126, similarly to the above-mentioned structures. As a result, residues in the processing chamber 126 can be removed.

A direct-current bias power source for applying negative direct-current bias voltage to the elements required to mainly be cleaned may furthermore be provided, similarly to the example shown in FIG. 10. In this case, residues of the element applied with the negative bias voltage can mainly be removed.

As an alternative to the high-frequency power source 194 and the aligning circuit 196, a plasma generating power source for producing an output of pulse voltage may be employed similarly to the example shown in FIG. 9 so as to generate plasma 204.

When the inside portion of the vaporizing container 110 and that of the processing chamber 126 are simultaneously cleaned as described above and the gas pressure in the vaporizing container 110 is maintained at a level suitable to perform discharge (generate plasma) in the vaporizing container 110, the gas pressure in the processing chamber 126 is, as a matter of course, made to be lower than that in the vaporizing container 110. The reason for this lies in that the processing chamber 126 is disposed adjacent to the vacuum exhausting unit 140 and the conductance of the gas is lowered by dint of the vaporized raw-material pipe 122 and the like. Therefore, there is apprehension that the gas pressure in the processing chamber 126 is excessively lowered to cause discharge (generate plasma) to take place in the processing chamber 126. In this case, at least either of the above-mentioned vaporized cleaning solution or the above-mentioned inert gas (that is, the nitrogen gas or the rare gas) may additionally be introduced into the processing chamber 126 when plasma is generated in the processing chamber 126 by using the exhaust gas 121. As a result, the gas pressure in the processing chamber 126 can be maintained at a level suitable to generate plasma as well as the gas pressure in the vaporizing container 110. To realize this, the valve 158 of the cleaning-solution supply apparatus 50a and the gas introducing pipe 128 are connected to each other through the pipe 198, the valves 200 and 201 and the flow-rate adjustment unit 202, for example, as shown in FIG. 12. As a result, at least either of the cleaning solution 154 vaporized in the cleaning-solution supply apparatus 150a or the inert gas 160 can be introduced into the processing chamber 126.

If discharge can be maintained in the vaporizing container 110 even if the gas pressure is relatively high, the valve 138 may be made to be a valve for adjusting the degree of opening so as to maintain the pressure of the gas in the processing chamber 126 at a level suitable to cause discharge to take place.

Since the present invention is structured as described above, the following effects can be obtained.

What is claimed is:

1. A method of cleaning a CVD apparatus having a vaporizer for vaporizing a liquid raw material by applying heat and a processing chamber for forming a thin film on a substrate by a CVD method by using the raw material vaporized by said vaporizer, comprising the steps of:
    introducing a cleaning solution comprising components for dissolving residues generated in said vaporizer and said processing chamber into said vaporizer and heating the cleaning solution so as to vaporize the cleaning solution while removing residues in the vaporizer; and
    introducing an exhaust gas containing the components of the cleaning solution supplied from said vaporizer to the inside portion of said processing chamber so as to remove residues in said processing chamber.

2. A method of cleaning a CVD apparatus according to claim 1, wherein the exhaust gas introduced into said processing chamber is used to generate plasma when residues are removed.

3. A method of cleaning a CVD apparatus according to claim 2, wherein an inert gas composed of at least either a nitrogen gas or a rare gas is introduced into said processing chamber causing a pressure when residues are removed so that the pressure in said processing chamber is controlled.

4. A method of cleaning a CVD apparatus having a vaporizer for vaporizing a liquid raw material by applying heat and a processing chamber for forming a thin film on a substrate by a CVD method by using the raw material vaporized by said vaporizer, comprising the steps of:
    introducing a cleaning solution comprising components for dissolving residues generated in said vaporizer and said processing chamber into said vaporizer in such a manner that the cleaning solution is in a vaporized state so as to remove residues in said vaporizer; and
    introducing an exhaust gas containing the components of the cleaning solution supplied from said vaporizer into said processing chamber so as to remove residues in said processing chamber.

5. A method of cleaning a CVD apparatus according to claim 4, wherein said vaporizer is heated when residues are removed.

6. A method of cleaning a CVD apparatus according to claim 4, wherein the exhaust gas introduced into said processing chamber is used to generate plasma when residues are removed.

7. A method of cleaning a CVD apparatus according to claim 6, wherein an inert gas composed of at least either or a nitrogen gas or a rare gas is introduced into said processing chamber when residues are removed so that the pressure in the gas in said processing chamber is controlled.

8. An apparatus for vaporizing a liquid raw material to remove residue comprising:
    a vaporizing container into which a liquid raw material is introduced and which is made of a conductive material;
    a heater for heating said vaporizing container to vaporize liquid introduced into said vaporizing container;
    at least one of cleaning-solution supply means and gas supply means, said cleaning-solution supply means for supplying, to the inside portion of said vaporizing container, a cleaning solution for solving residues generated in said vaporizing container, said gas supply means for supplying an inert gas composed of at least either of a nitrogen gas or rare gas to the inside portion of said vaporizing container;
    electrode means disposed in said vaporizing container in such a manner that said electrode means is electrically insulated from said vaporizing container; and a plasma generating power source for supplying high-frequency electric power or pulse voltage to a position between said electrode means and said vaporizing container to generate plasma in said vaporizing container by using the vaporized cleaning solution and/or the inert gas.

9. An apparatus for vaporizing a liquid raw material according to claim 8, wherein said cleaning-solution supply means supplies, to the inside portion of said vaporizing container, the cleaning solution in a vaporized state.

10. An apparatus for vaporizing a liquid raw material according to claim 9, further comprising a direct-current power source for applying negative direct-current bias voltage to either of said vaporizing container or said electrode means.

11. An apparatus for vaporizing a liquid raw material according to claim 10, further comprising magnetic-field forming means for forming a magnetic field which is perpendicular to an electric field generated by said plasma generating power.

12. A method of cleaning a CVD apparatus incorporating an apparatus for vaporizing a liquid raw material and a processing chamber for forming a thin film on a substrate by a CVD method by using the raw material vaporized in said vaporizing apparatus, said method comprising the steps of:

introducing an exhaust gas generated after residues in said vaporizing container have been removed by using the plasma while the inside portion of said processing chamber is vacuum-exhausted; and generating plasma in said processing chamber by using the exhaust gas so that residues in said processing chamber are removed simultaneously with performing removal of residues in said vaporizing container.

13. A method of cleaning a CVD apparatus according to claim 12, wherein at least either of the vaporized cleaning solution for solving residues generated in said processing chamber or the inert gas is furthermore introduced into said processing chamber when plasma is generated in said processing chamber by using the exhaust gas.

* * * * *